(12) United States Patent
Wang et al.

(10) Patent No.: US 12,737,065 B2
(45) **Date of Patent: *Sep. 15, 2026**

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yu Wang, Beijing (CN); Ping Wen, Beijing (CN); Yi Zhang, Beijing (CN); Yuanqi Zhang, Beijing (CN); Wei Wang, Beijing (CN); Yang Zeng, Beijing (CN); Shun Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/303,395

(22) Filed: Aug. 19, 2025

(65) Prior Publication Data

US 2025/0383730 A1 Dec. 18, 2025

Related U.S. Application Data

(63) Continuation of application No. 18/563,398, filed as application No. PCT/CN2021/096000 on May 26, 2021, now Pat. No. 12,443,300.

(51) Int. Cl.
*G06F 3/041* (2006.01)
*H10K 59/40* (2023.01)

(52) U.S. Cl.
CPC ........ *G06F 3/0412* (2013.01); *G06F 3/04164* (2019.05); *G06F 2203/04111* (2013.01); *G06F 2203/04112* (2013.01); *H10K 59/40* (2023.02)

(58) Field of Classification Search
None
See application file for complete search history.

(56) References Cited

U.S. PATENT DOCUMENTS 12,443,300 B2 * 10/2025 Wang .................... G06F 3/0412

* cited by examiner

*Primary Examiner* — Ifedayo B Iluyomade

(57) ABSTRACT

A display substrate includes: a base substrate, including a display area and a non-display area around the display area; a blocking dam, located in the non-display area and arranged surrounding the display area; multiple touch-control lines, located in the non-display area, at least some touch-control lines comprise conductive winding portions; an orthographic projection of a conductive winding portion on the base substrate is between an orthographic projection of the blocking dam on the base substrate and the display area; the at least some touch-control lines comprise multiple first touch-control lines and second touch-control lines, a conductive winding portion of at least one first touch-control line of the first touch-control lines is arranged in an independent winding manner, and a conductive winding portion of at least one second touch-control line of the second touch-control lines are arranged in a mutually nested winding manner.

18 Claims, 20 Drawing Sheets

DISPLAY SUBSTRATE AND DISPLAY APPARATUS

CROSS-REFERENCE TO RELATED APPLICATIONS

This application is a continuation of U.S. patent application Ser. No. 18/563,398 filed on Nov. 22, 2023, which is a national stage application of PCT Application No. PCT/CN2021/096000, which is filed on May 26, 2021, and entitled "Display Substrate and Display Apparatus". The entire contents of the above-identified applications are incorporated herein by reference.

TECHNICAL FIELD

The present invention relates to the field of display technologies, and particularly to a display substrate and a display apparatus.

BACKGROUND

An organic electroluminescent (OLED) display apparatus is a display screen based on an organic electroluminescent diode. It has excellent characteristics such as self-luminescence, high contrast, thin thickness, wide viewing angle, fast response speed, applicable in a flexible panel, wide temperature range, simple structure and manufacturing process, etc., and has attracted more and more attention and broad application prospects. In the related technology, the touch control function is integrated by using the touch control structure nested in the OLED display module, so as to realize the integration of the display function and touch control function of the OLED display apparatus.

SUMMARY

Embodiments of the disclosure provide a display substrate and a display apparatus, the specific schemes of which are as follows.

In a first aspect, an embodiment of the present disclosure provides a display substrate, including:

- a base substrate including a display area and a non-display area located around the display area;
- a blocking dam located in the non-display area and arranged surrounding the display area; and
- a plurality of touch-control lines located in the non-display area, wherein at least some of the touch-control lines include conductive winding portions, to make resistances of the touch-control lines substantially same, an orthographic projection of a conductive winding portion on the base substrate is located between an orthographic projection of the blocking dam on the base substrate and the display area;
- wherein the at least some of the touch-control lines include a plurality of first touch-control lines and a plurality of second touch-control lines, a conductive winding portion of each of the first touch-control lines is arranged in an independent winding manner, and conductive winding portions of all the second touch-control lines are arranged in a mutually nested winding manner.

In some embodiments, in the display substrate provided by the embodiment of the present disclosure, the non-display area includes a first non-display area for bonding with a touch-control chip.

The display substrate further includes a plurality of first touch-control electrodes located in the display area, each of the first touch-control electrodes extends in a first direction, and at least some of the first touch-control electrodes are electrically connected with the first touch-control lines, and the first direction is a direction from the first non-display area to the display area.

The first touch-control lines are located in the first non-display area, and conductive winding portions of the first touch-control lines are electrically connected with first touch-control electrodes.

In some embodiments, in the display substrate provided by the embodiment of the present disclosure, a width of a conductive winding portion of a first touch-control line is substantially the same as a width of a first touch-control electrode in a second direction, and the second direction intersects the first direction.

In some embodiments, in the display substrate provided by the embodiment of the present disclosure, all the first touch-control lines converge to a side of the first non-display area.

A length of the conductive winding portion included in the first touch-control line is negatively correlated with a distance from the conductive winding portion included in the first touch-control line to the converged side.

In some embodiments, in the display substrate provided by the embodiment of the present disclosure, the first touch-control line further includes a fan-out lead portion for connecting the conductive winding portion with the touch-control chip, and the fan-out lead portion is located on a side of conductive winding portions included in all the first touch-control lines away from the display area.

The fan-out lead portion includes a first dislocation structure located on a side of an area between adjacent conductive winding portions away from the display area, and distances between the same fan-out lead portion and an adjacent first touch-control line are substantially the same at different positions of the conductive winding portion.

In some embodiments, in the display substrate provided by the embodiment of the present disclosure, the first dislocation structure is a slope line segment sloping from a longer conductive winding portion included in adjacent first touch-control lines to a shorter conductive winding portion included in the adjacent first touch-control lines.

In some embodiments, in the display substrate provided by the embodiment of the present disclosure, lengths of first dislocation structures between adjacent conductive winding portions decreases or increases in a direction away from the display area.

In some embodiments, in the display substrate provided by the embodiment of the present disclosure, the conductive winding portion of the first touch-control line includes a first line segment and a second line segment that are alternately and sequentially connected and extend substantially in a second direction intersected with the first direction, a minimum distance from the first line segment to the display area is smaller than a minimum distance from the second line segment to the display area, and connection between the first line segment and the second line segment is a straight line segment or an arc line segment.

In some embodiments, in the display substrate provided by the embodiment of the present disclosure, a line width of a first line segment with a smallest distance from the display area is greater than line widths of other first line segments and line widths of all the second line segments, and the line widths of the other first line segments and the line widths of all the second line segments are substantially equal.

In some embodiments, in the display substrate provided by the embodiment of the present disclosure, the non-display area further includes a second non-display area opposite to the first non-display area, and a third non-display area connecting the first non-display area and the second non-display area.

The plurality of touch-control lines further include a plurality of third touch-control lines that extend from the second non-display area to the first non-display area via the third non-display area, a third touch-control line is electrically connected with the first touch-control electrode, and the first touch-control electrode electrically connected with the third touch-control line and the first touch-control electrode electrically connected with the first touch-control line are the same or different.

In some embodiments, in the display substrate provided by the embodiment of the present disclosure, a line width of the third touch-control line in the third non-display area is greater than a line width of the third touch-control line in the first non-display area and smaller than a line width of the third touch-control line in the second non-display area.

In some embodiments, in the display substrate provided by the embodiment of the present disclosure, in the first non-display area, line widths of the third touch-control lines are substantially the same; in the third non-display area, the line widths of the third touch-control lines are substantially the same; and in the second non-display area, the line width of the third touch-control line is positively correlated with a distance from the first touch-control electrode electrically connected with the third touch-control line to the third non-display area.

In some embodiments, in the display substrate provided by the embodiment of the present disclosure, the non-display area further includes a fourth non-display area opposite to the third non-display area.

The plurality of second touch-control lines extend from the fourth non-display area to the first non-display area, and the conductive winding portion of the second touch-control line is located on a side of all the first touch-control lines away from the display area.

In some embodiments, in the display substrate provided by the embodiment of the present disclosure, a width of the conductive winding portion of the second touch-control line is substantially the same as a width of at least one of the first touch-control electrodes in a second direction intersected with the first direction.

In some embodiments, in the display substrate provided by the embodiment of the present disclosure, the conductive winding portion of the second touch-control line includes a second dislocation structure located on a side of an area between conductive winding portions included in adjacent first touch-control lines away from the display area, and distances between the conductive winding portion included in the same second touch-control line and an adjacent first touch-control line are substantially the same at different positions of the conductive winding portion included in the first touch-control line.

In some embodiments, in the display substrate provided by the embodiment of the present disclosure, the second dislocation structure is a straight line segment perpendicular to the second direction or a slope line segment sloping from a longer conductive winding portion included in adjacent first touch-control lines to a shorter conductive winding portion included in the adjacent first touch-control lines.

In some embodiments, in the display substrate provided by the embodiment of the present disclosure, lengths of second dislocation structures between the conductive winding portions included in the adjacent first touch-control lines are substantially the same.

In some embodiments, in the display substrate provided by the embodiment of the present disclosure, a length of the conductive winding portion included in the second touch-control line is negatively correlated with a minimum distance from the conductive winding portion of the second touch-control line to the display area.

In some embodiments, in the display substrate provided by the embodiment of the present disclosure, among the conductive winding portions of all the second touch-control lines, a line width of an outermost conductive winding portion is greater than line widths of other nested conductive winding portions, and the line widths of the other conductive winding portions are substantially the same.

In some embodiments, the display substrate provided by the embodiment of the present disclosure further includes a plurality of second touch-control electrodes located in the display area, the second touch-control electrodes extend in a second direction that intersects the first direction, and the second touch-control electrodes are electrically connected with the second touch-control lines.

In some embodiments, in the display substrate provided by the embodiment of the present disclosure, a minimum distance between an orthographic projection of all the conductive winding portions on the base substrate and an orthographic projection of the blocking dam on the base substrate is greater than or equal to 130 μm; and a minimum distance between the orthographic projection of all the conductive winding portions on the base substrate and the display area is greater than or equal to 20 μm.

In another aspect, an embodiment of the present disclosure further provides a display apparatus, including the display substrate provided in the embodiment of the present disclosure.

DETAILED DESCRIPTION

Figure 1:
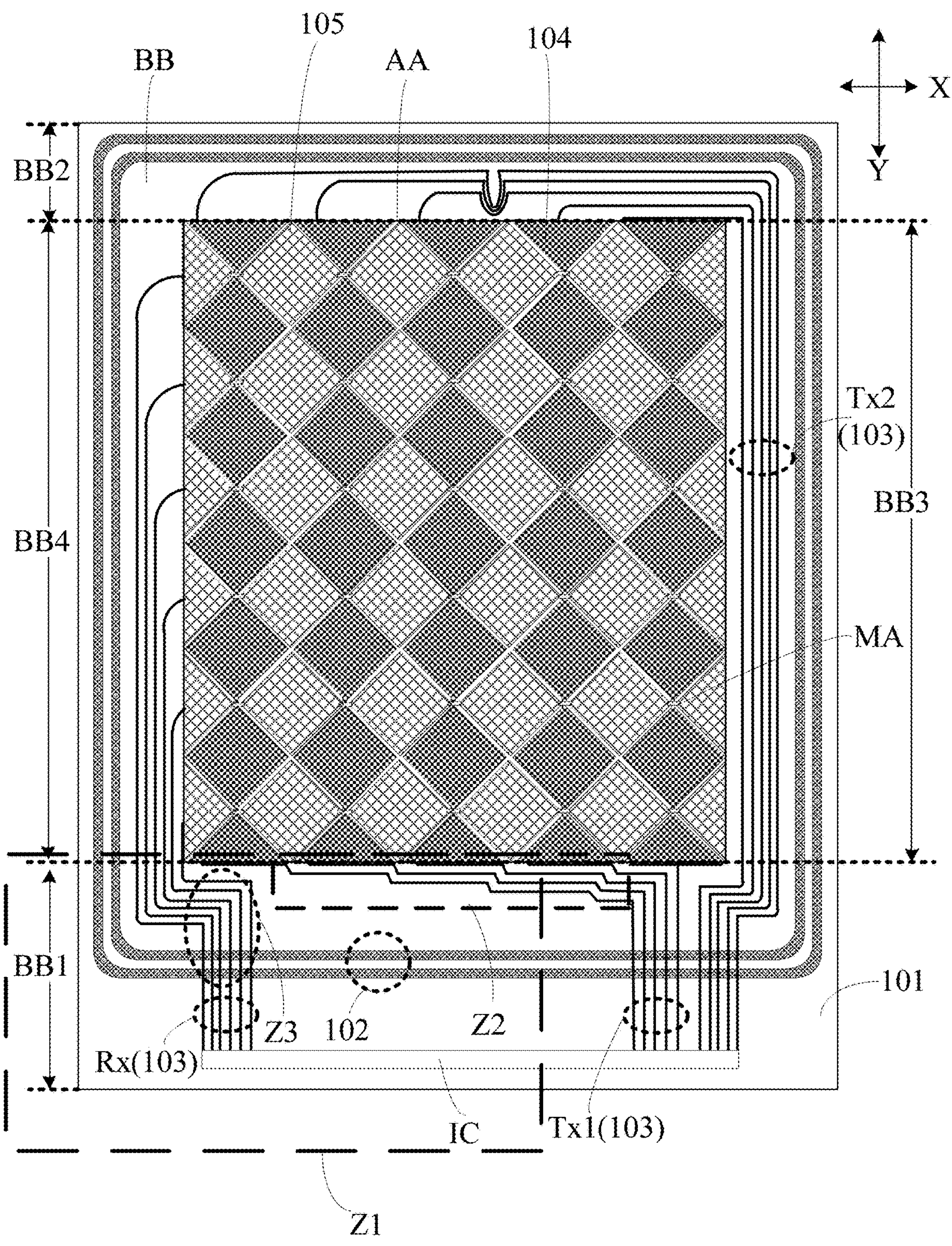
FIG. 1 is a schematic diagram of a structure of a display substrate according to an embodiment of the present disclosure.

In order to make objectives, technical solutions and advantages of the embodiments of the present disclosure more clear, the technical solutions of the embodiments of the present disclosure will be clearly and completely described below with reference to the drawings of the embodiments of the present disclosure. It should be noted that sizes and shapes of various figures in the drawings do not reflect real proportions, and are only for the purpose of schematically illustrating contents of the present disclosure. Moreover, the same or similar elements and the elements having same or similar functions are denoted by same or similar reference numerals throughout the descriptions. Apparently, the described embodiments are a part of the embodiments of the present disclosure, not all of the embodiments. Based on the described embodiments of the present disclosure, all other embodiments obtained by those of ordinary skills in the art without inventive effort are covered by the scope of protection of the present disclosure.

Unless otherwise defined, technical terms or scientific terms used herein shall have an ordinary meaning understood by those with ordinary skills in the art to which the present disclosure pertains. The "first", "second" and similar terms used in the description and claims of the present disclosure do not indicate any order, quantity, or importance, but are used only for distinguishing different components. "Include", "contain", or similar words mean that elements or objects appearing before the words cover elements or objects listed after the words and their equivalents, but do not exclude other elements or objects. "In", "out", "Upper", "lower", etc., are used to represent relative position relations, and when an absolute position of a described object is changed, the relative position relation may also be correspondingly changed.

In related technologies, two layers of metal are used to make touch-control function layers, one layer is a Metal Mesh layer and the other is a Bridge layer. The Metal Mesh is located in a display area AA, and may be divided into touch-control driving electrodes and touch-control sensing electrodes according to the horizontal and vertical directions, wherein the touch-control driving electrodes or the touch sensing electrodes of the touch-control driving electrodes and the touch sensing electrodes are connected to each other, and the other are connected through the bridge layer. Therefore, there is no need to add a touch-control module (TSP), so that the thickness of the screen can be reduced, which is beneficial to folding; at the same time, there is no fit tolerance, which can reduce the width of the frame.

In addition, in order to provide effective signals to the touch-control driving electrodes and the touch-control sensing electrodes, a plurality of touch-control lines are provided in a non-display area around the display area AA. However, due to the limitation of spatial distribution, distances between starting points and ending points of the touch-control lines are inconsistent, which may lead to different lengths of the touch-control lines, resulting in great resistance difference between touch-control lines and affecting the touch-control electrical performance. Under the trend of pursuing high-precision touch-control performance, it is apparent that higher requirements are put forward for the wiring design of touch-control lines.

In order to solve at least the above technical problems existing in the related art, an embodiment of the present disclosure provides a display substrate, as shown in FIGS. 1 to 6, which may include a base substrate 101, a blocking dam 102 and a plurality of touch-control lines 103.

The base substrate 101 includes a display area AA and a non-display area BB located around the display area AA.

The blocking dam 102 is located in the non-display area BB and arranged surrounding the display area AA.

The plurality of touch-control lines 103 are located in the non-display area BB. At least some of the touch-control lines 103 include conductive winding portions 1031 to enable resistances of the touch-control lines 103 are substantially the same, an orthographic projection of the conductive winding portion 1031 on the base substrate 101 is located between an orthographic projection of the blocking dam 102 on the base substrate 101 and the display area AA.

The at least some of the touch-control lines 103 may include a plurality of first touch-control lines Tx1 and a plurality of second touch-control lines Rx. The conductive winding portion 1031 of each of the first touch-control lines Tx1 is arranged in an independent winding manner, and the conductive winding portions 1031 of all the second touch-control lines Rx are arranged in a mutually nested winding manner.

In the display substrate provided by the embodiment of the present disclosure, by arranging the conductive winding portion 1031 of each of the first touch-control lines Tx1 in the independent winding manner, and arranging the conductive winding portions 1031 of all the second touch-control lines Rx in the mutually nested winding manner, resistances of the at least some of the touch-control lines 103 including the plurality of first touch-control lines Tx1 and the plurality of second touch-control lines Rx are substantially the same as resistances of other touch-control lines 103 not including the conductive winding portions 103, that is, resistance differences between the touch-control lines 103 are within an acceptable range (for example, 10%), thus effectively alleviating the influence of large resistance differences between the touch-control lines 103 on touch control and facilitating the improvement of touch control performance. Furthermore, the conductive winding section 1031 of the present disclosure is provided in an area between the blocking dam 102 and the display area AA, so that a space inside the blocking dam 102 can be reasonably utilized, and thus there is no need to increase a width of the non-display area BB.

It should be noted that in the display substrate provided by the embodiment of the present disclosure, due to the limitation of process conditions or the influence of other factors such as measurement, "substantial" may mean being completely equivalent, or there may be some deviations. Therefore, the "substantial" relationship between various features belongs to the protection scope of the present disclosure as long as the error (for example, the fluctuation of 10% up and down) is allowed.

Figure 2:
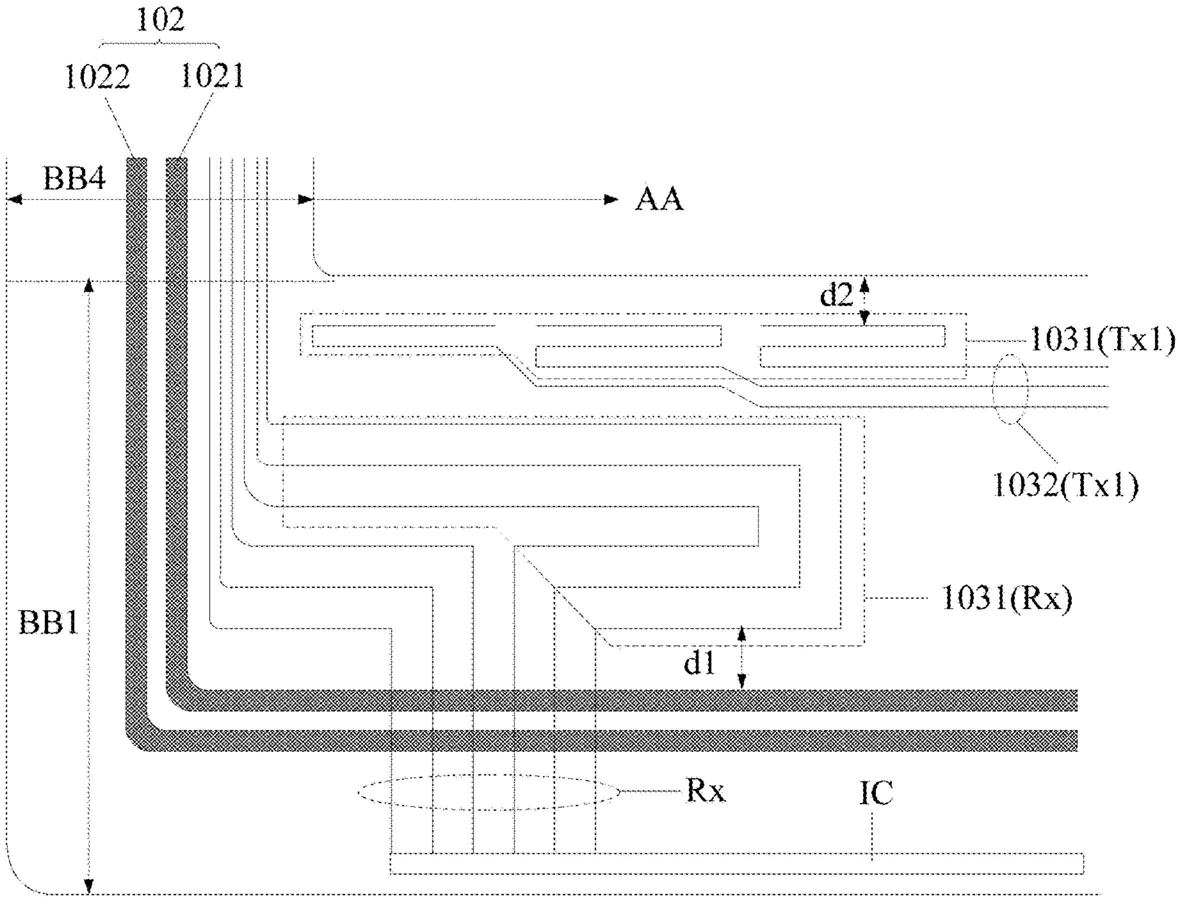
FIG. 2 is an enlarged schematic diagram of a structure of area Z1 in FIG. 1.
Figure 4:
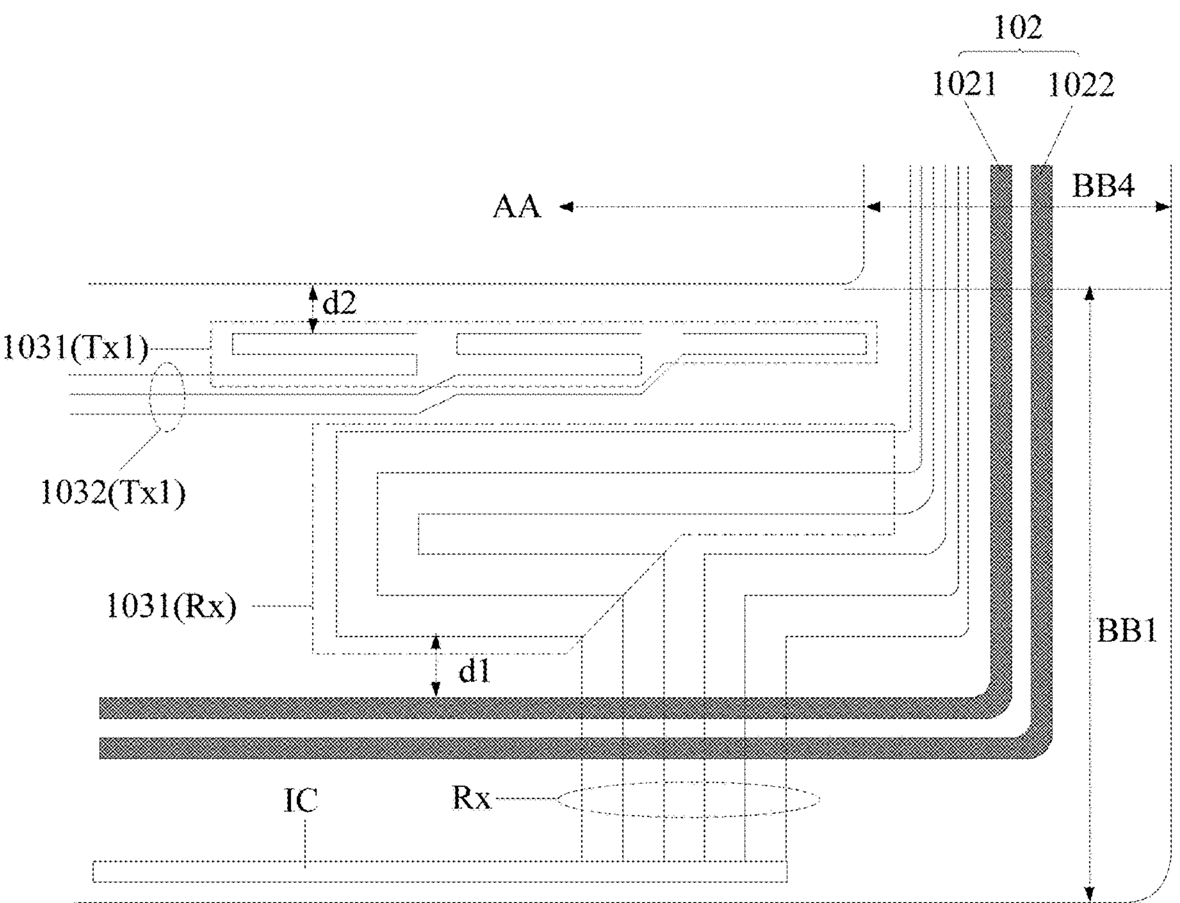
FIG. 4 is an enlarged schematic diagram of a structure of area Z4 in FIG. 1.
Figure 5:
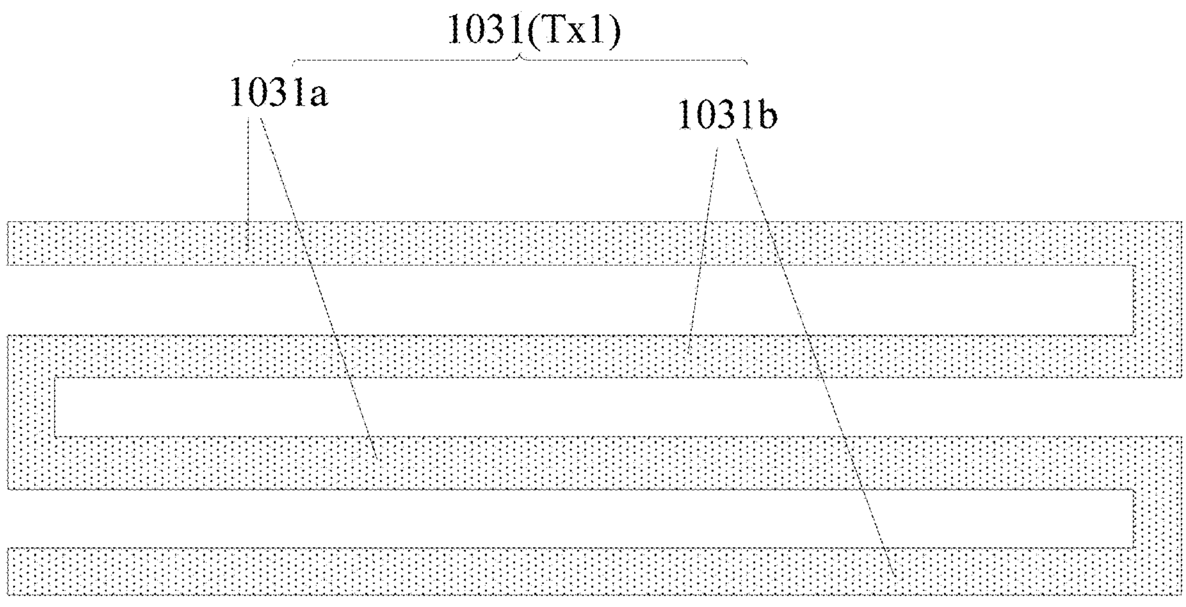
FIG. 5 is a schematic diagram of wiring of conductive winding portions of first touch-control lines.
Figure 6:
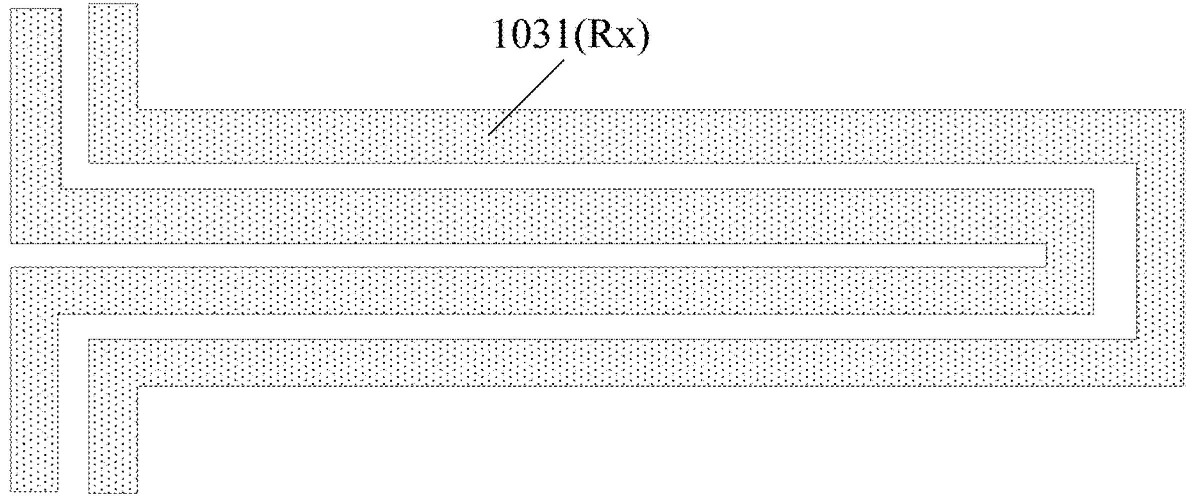
FIG. 6 is a schematic diagram of nesting arrangement of conductive winding portions of second touch-control lines.
Figure 7:
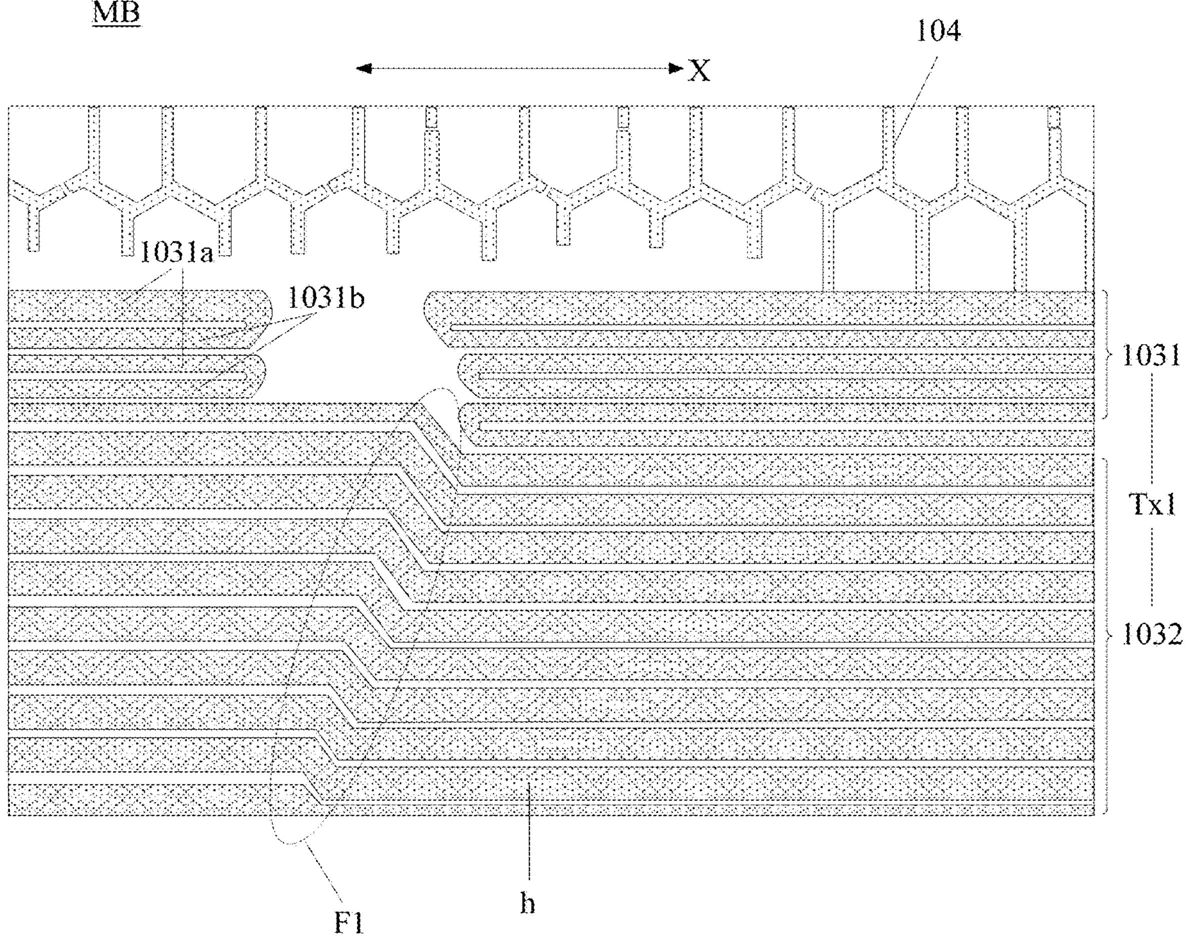
FIG. 7 is an enlarged schematic diagram of a structure of area Z2 in FIG. 1.
Figure 8:
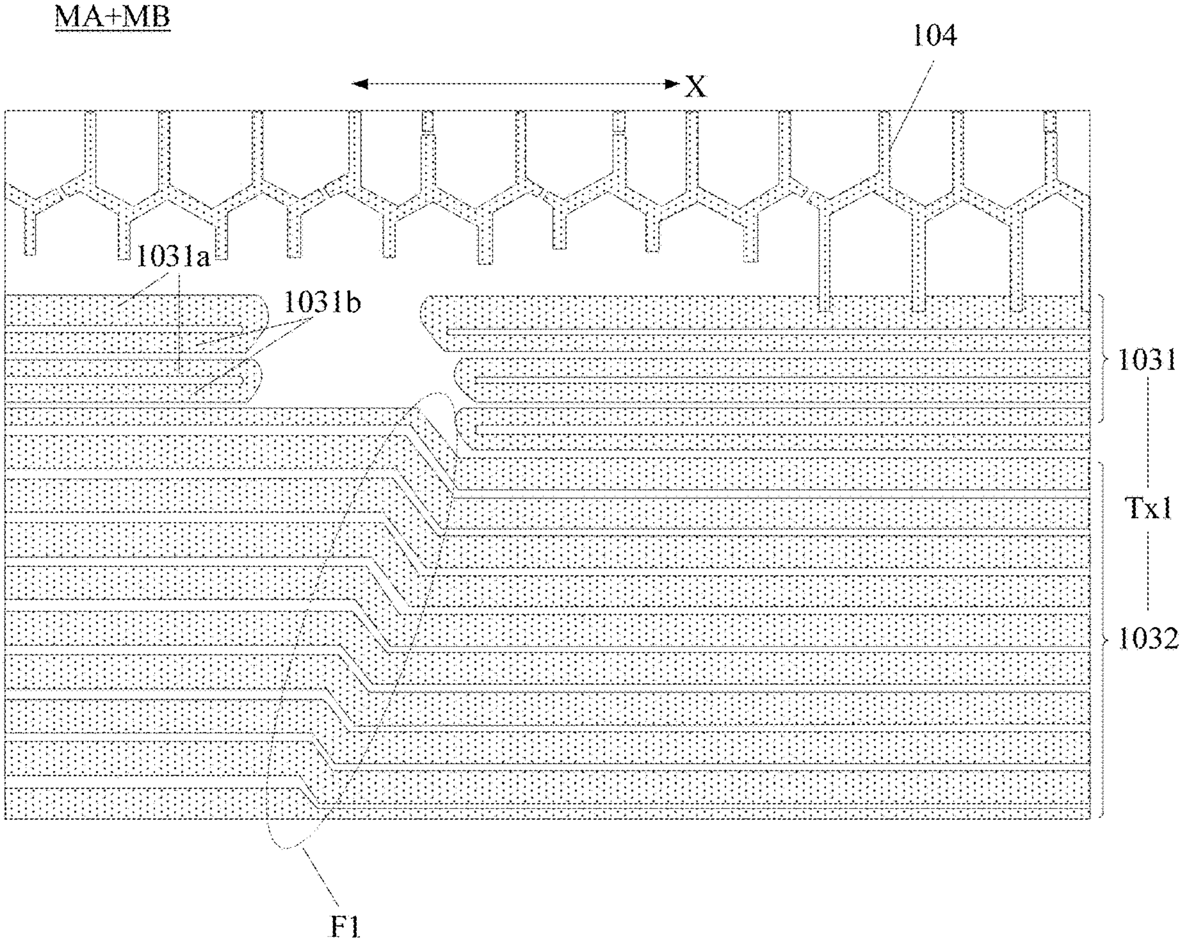
FIG. 8 is a schematic diagram of a structure of a layer where a touch-control electrode is located in FIG. 7.
Figure 9:
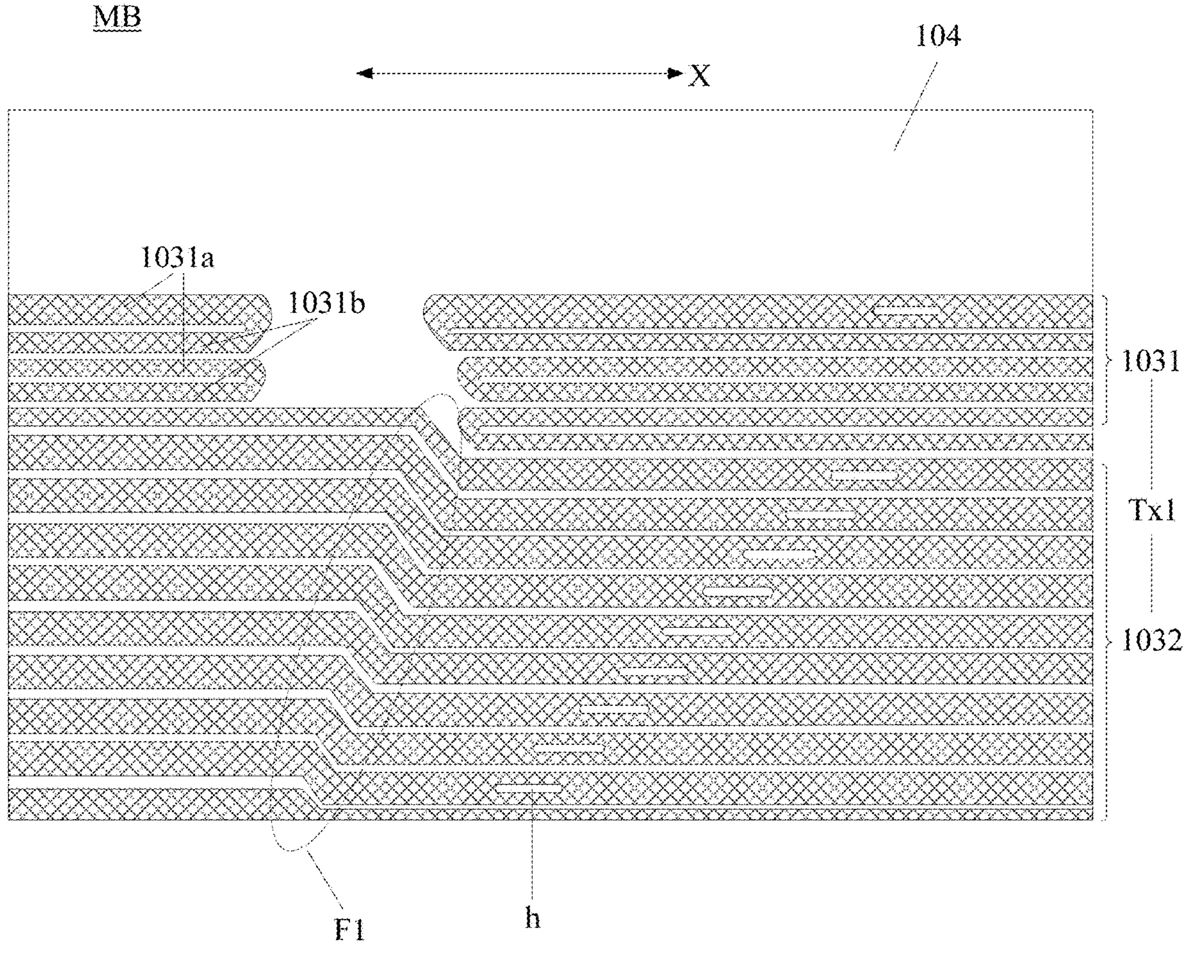
FIG. 9 is a schematic diagram of a structure of a bridge layer in FIG. 7.
Figure 10:
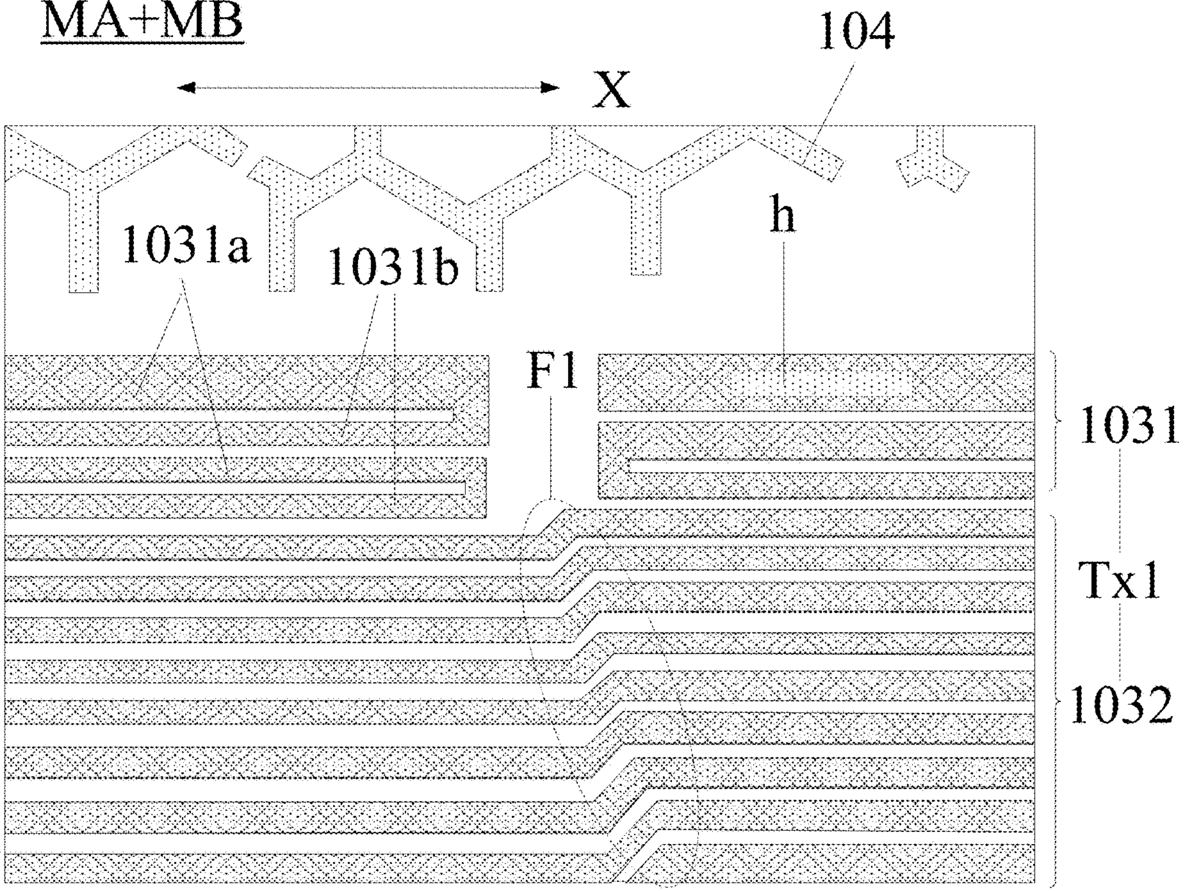
FIG. 10 is an enlarged schematic diagram of a structure of area Z5 in FIG. 3.
Figure 11:
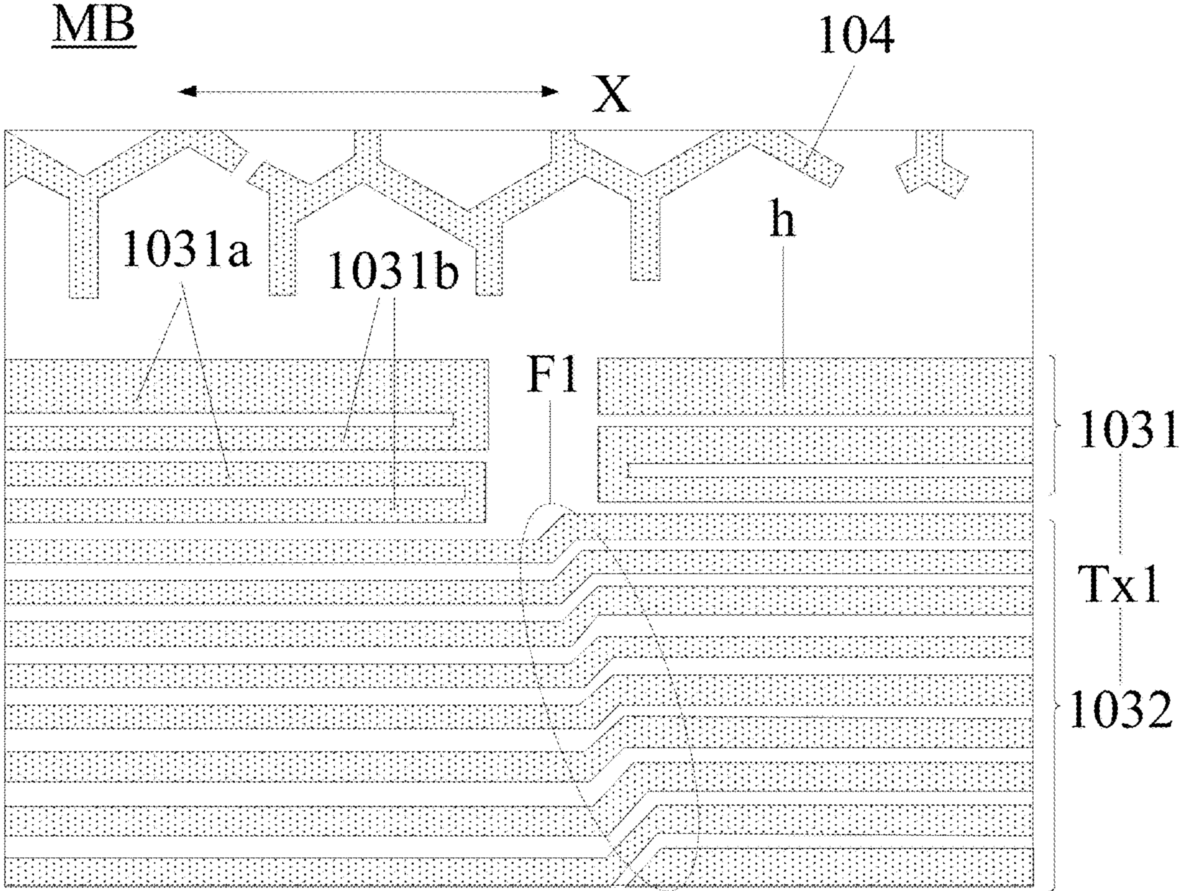
FIG. 11 is a schematic diagram of a structure of a layer where the touch-control electrode is located in FIG. 10.
Figure 12:
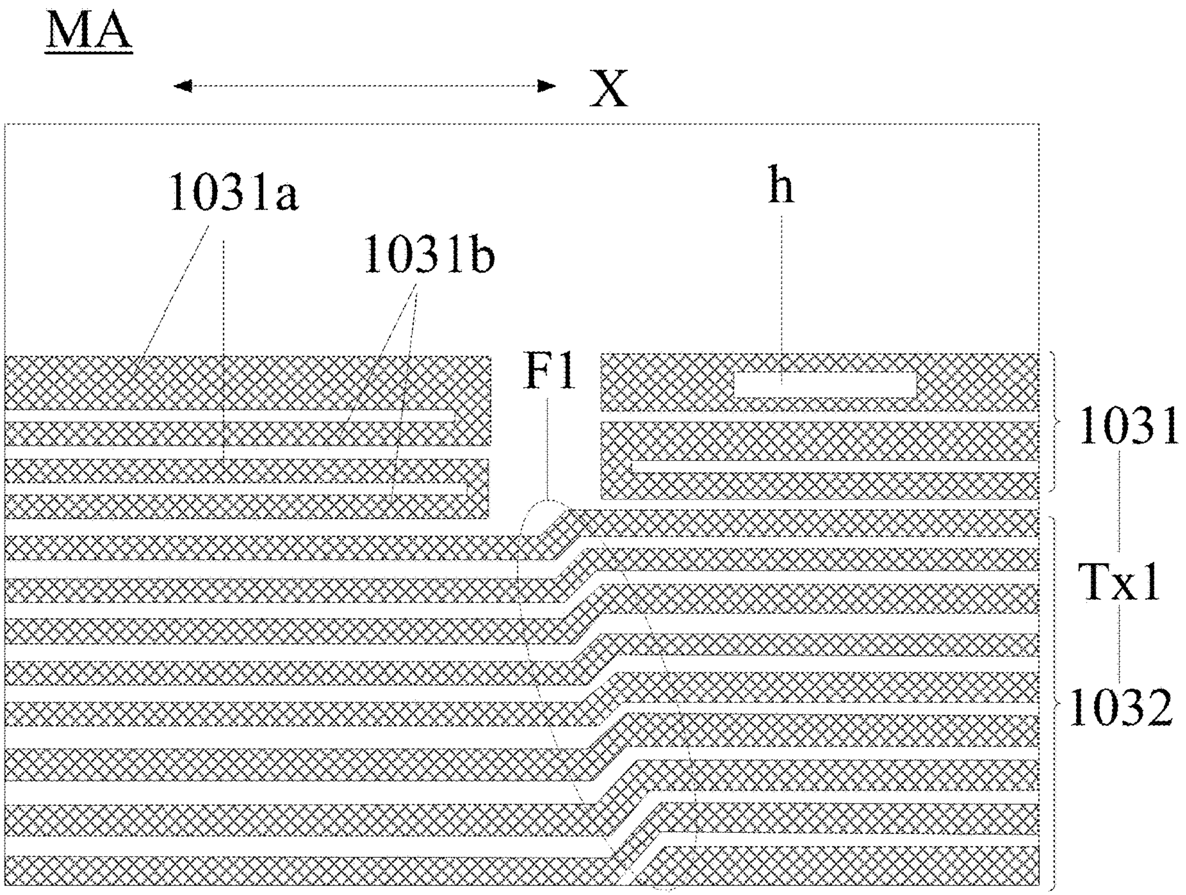
FIG. 12 is a schematic diagram of a bridge layer in FIG. 10.
Figure 13:
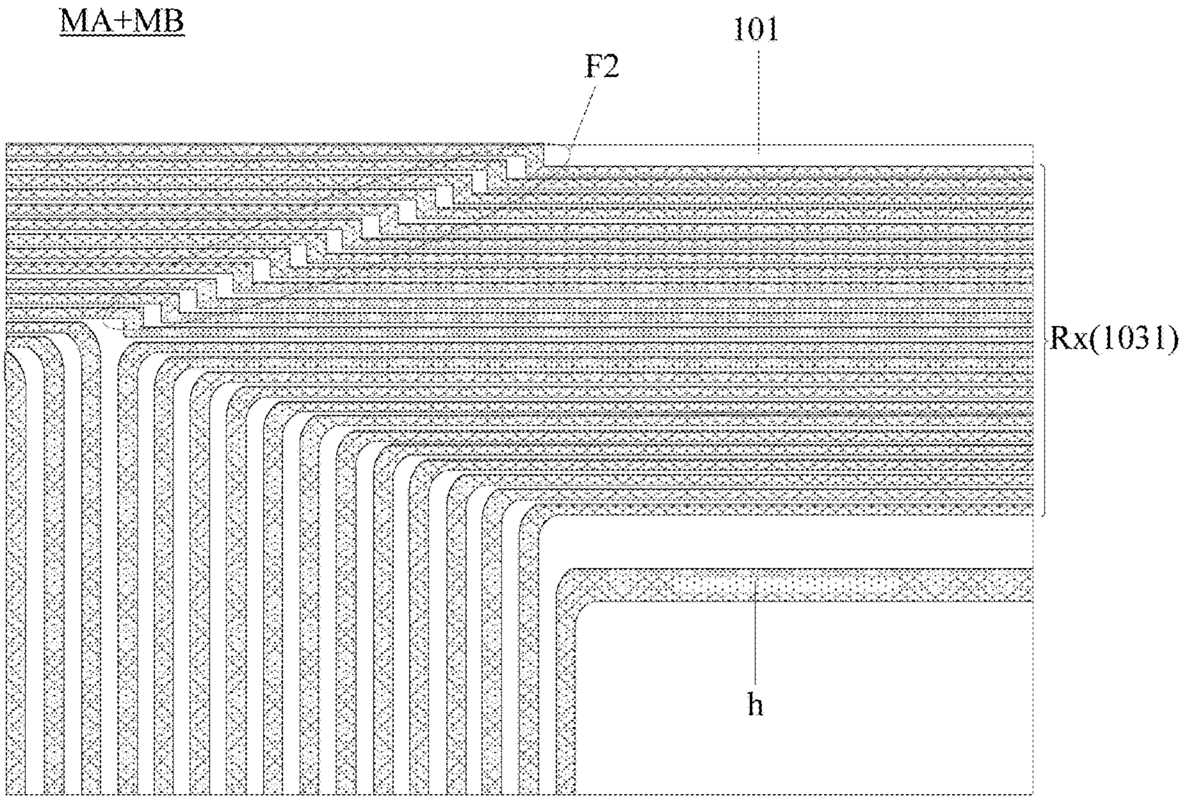
FIG. 13 is an enlarged schematic diagram of a structure of Z3 in FIG. 1.
Figure 14:
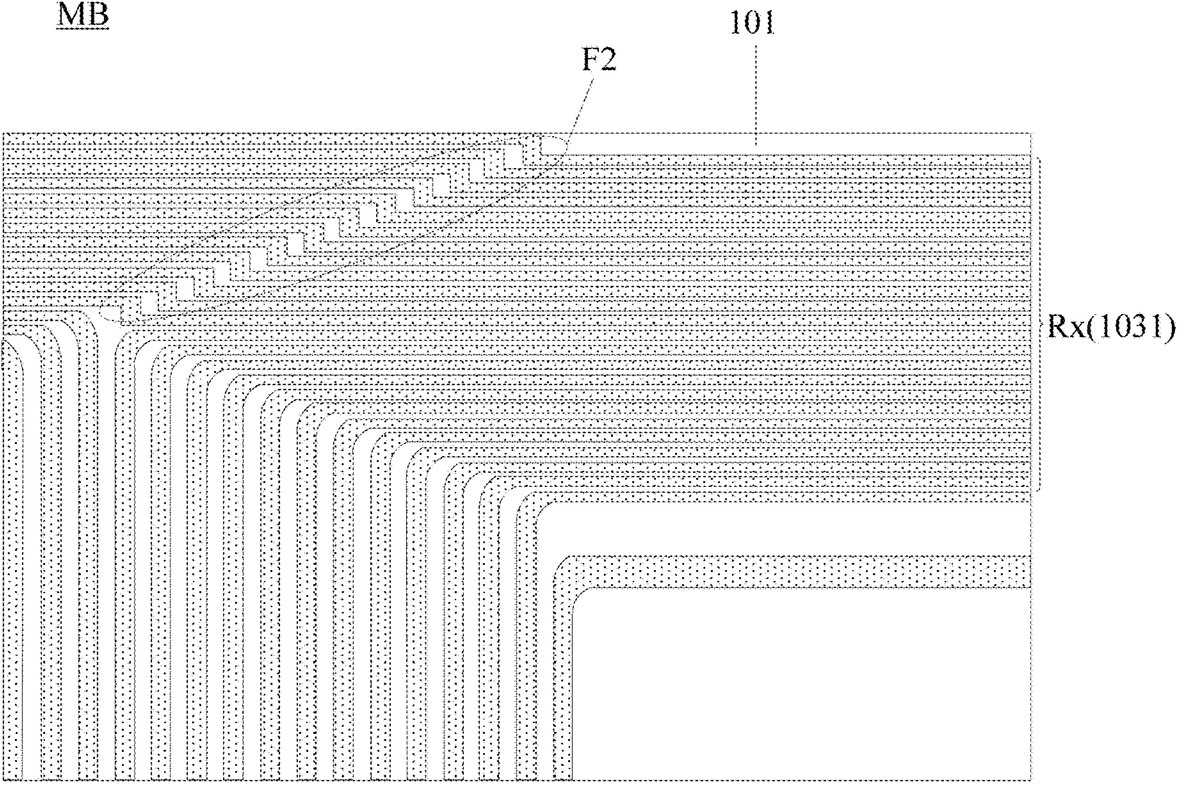
FIG. 14 is a schematic diagram of a structure of a layer where the touch-control electrode is located in FIG. 13.
Figure 15:
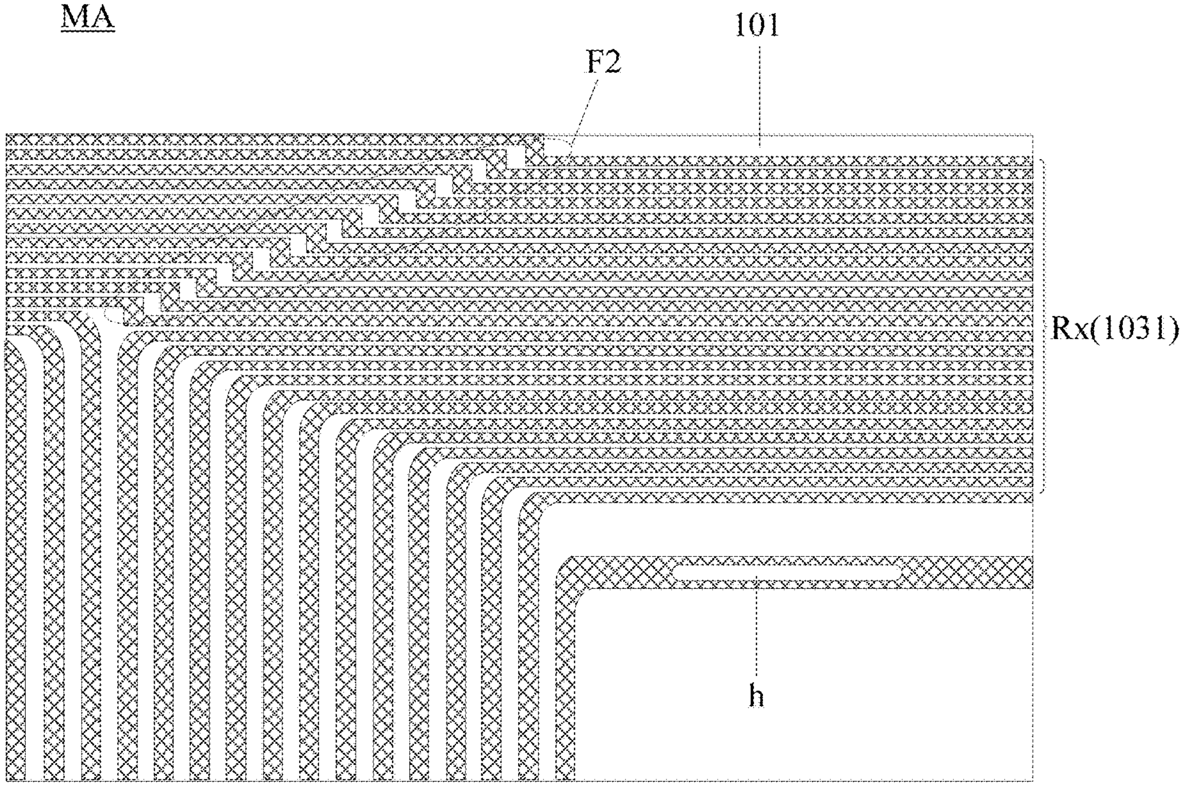
FIG. 15 is a schematic diagram of a bridge layer in FIG. 13.
Figure 16:
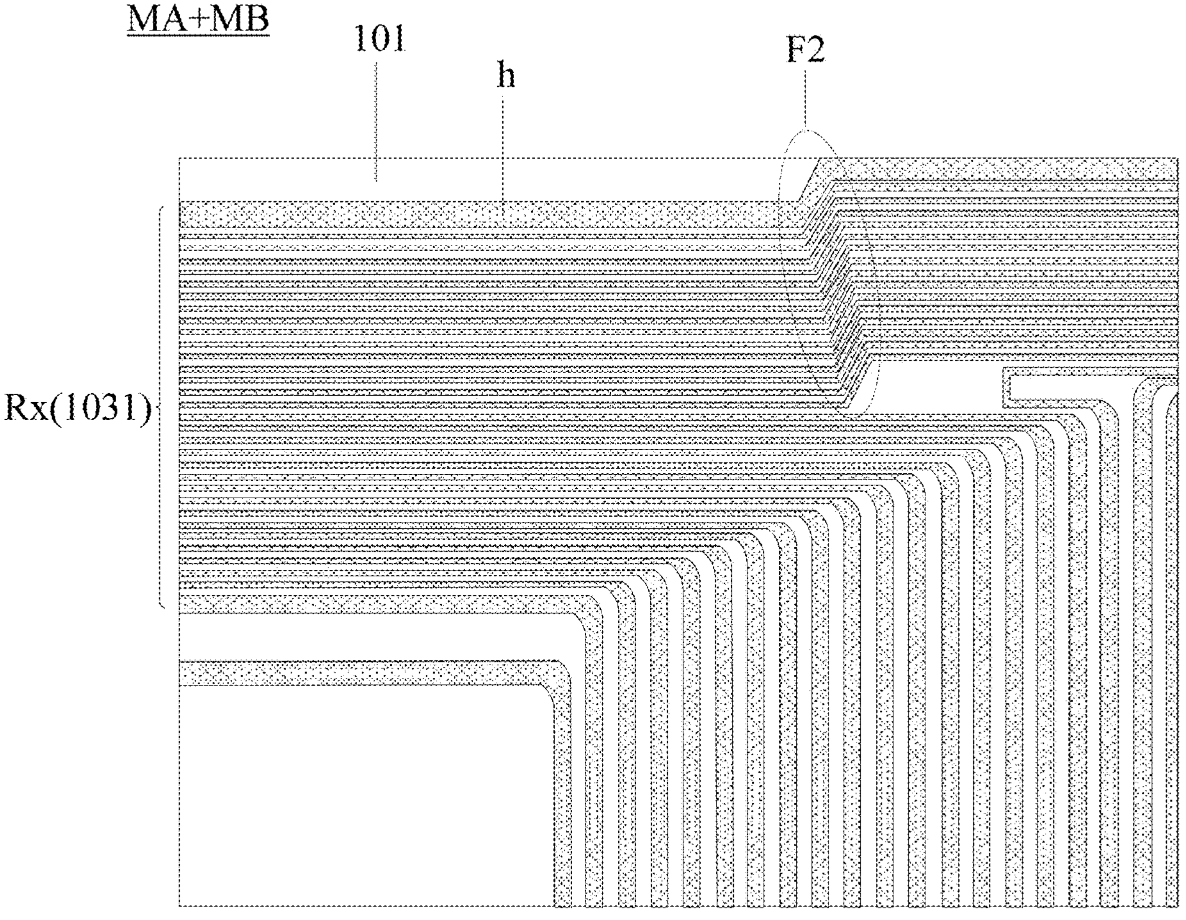
FIG. 16 is an enlarged schematic diagram of a structure of area Z6 in FIG. 3.
Figure 17:
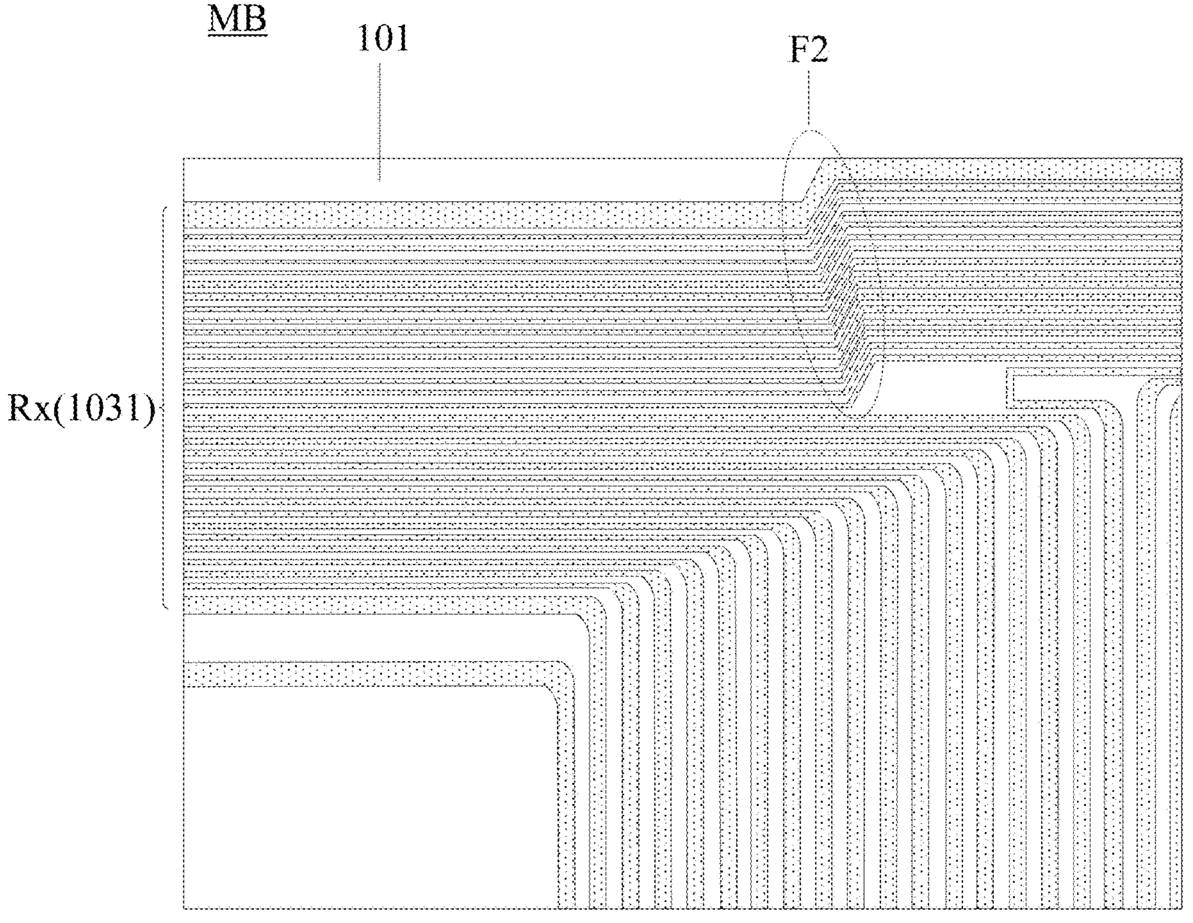
FIG. 17 is a schematic diagram of a structure of a layer where the touch-control electrode is located in FIG. 16.
Figure 18:
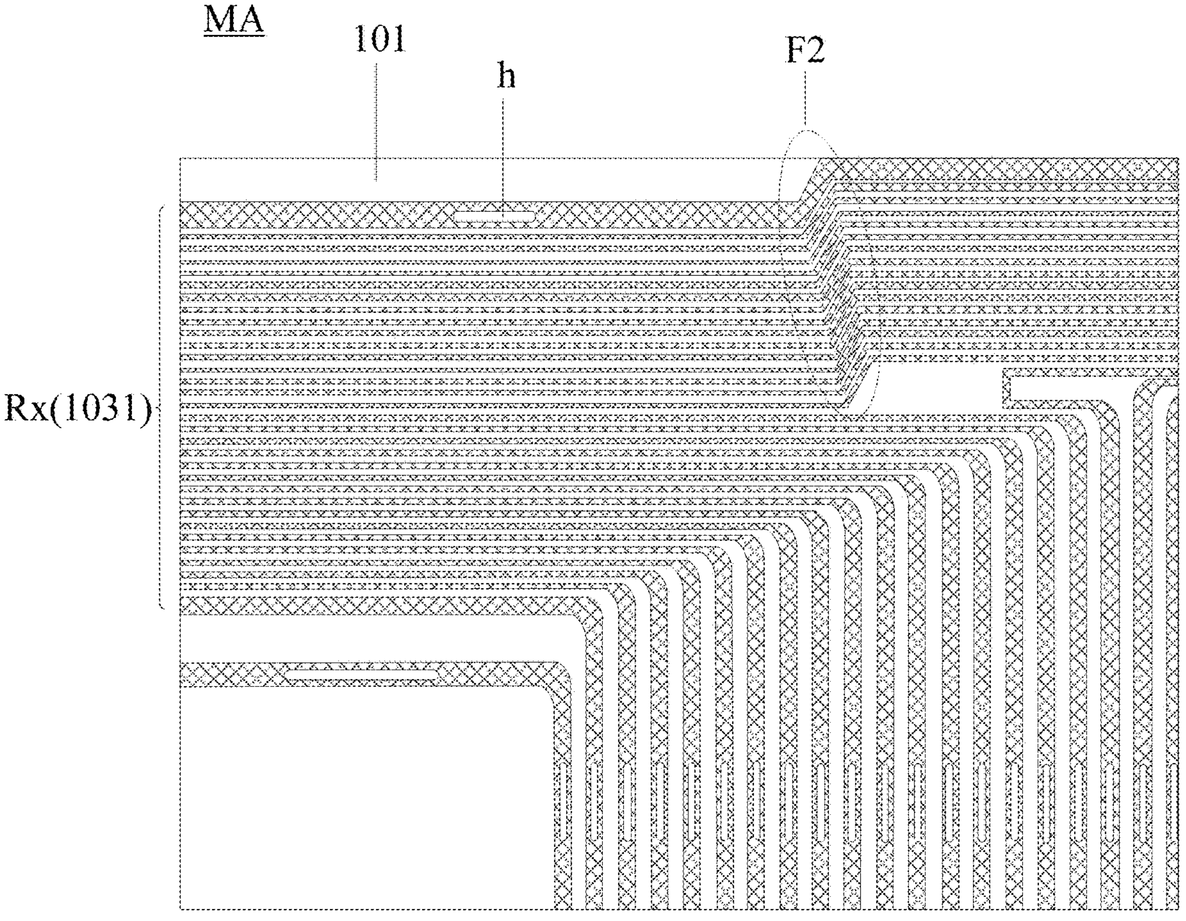
FIG. 18 is a schematic diagram of a bridge layer in FIG. 16.

In some embodiments, in the display substrate provided by the embodiment of the present disclosure, as shown in FIGS. 2 and 4, the blocking dam 102 may include a first blocking dam 1021 surrounding the display area AA and a second blocking dam 1022 surrounding the first blocking dam 1021. For the convenience of wiring, a minimum distance d1 between an orthographic projection of all the conductive winding portions 1031 on the base substrate 101 and an orthographic projection of the blocking dam 102 on the base substrate 101 may be greater than or equal to 130 μm; and a minimum distance d2 between the orthographic projection of all the conductive winding portions 1031 on the base substrate 101 and the display area AA may be greater than or equal to 20 μm.

In some embodiments, in the display substrate provided by the embodiment of the present disclosure, as shown in FIGS. 1 to 4, the non-display area BB may include a first non-display area BB1 for binding with the touch-control chip IC.

The display substrate may further include a plurality of first touch-control electrodes 104 located in the display area BB, each of the first touch-control electrodes 104 extends in a first direction Y, at least some of the first touch-control electrodes 104 are electrically connected with the first touch-control line Tx1, and the first direction Y is a direction from the first non-display area BB1 to the display area AA.

The first touch-control line Tx1 may be located in the first non-display area BB1, and the conductive winding portion 1031 of the first touch-control line BB1 is electrically connected with the first touch-control electrode 104.

Figure 3:
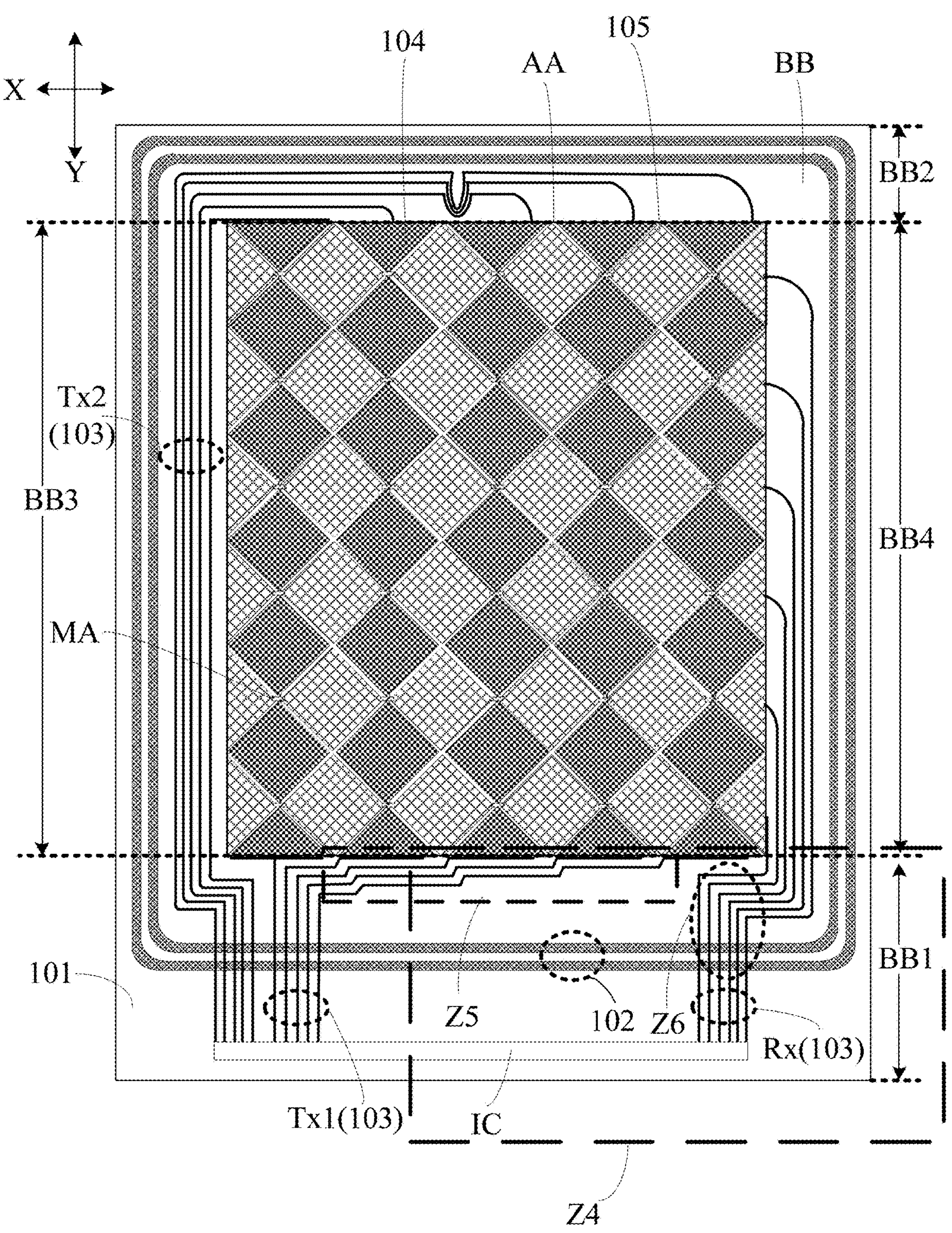
FIG. 3 is a schematic diagram of another structure of a display substrate according to an embodiment of the present disclosure.

As can be seen from FIGS. 1 and 3, a first touch-control line Tx1 connecting the first touch-control electrode 104 and the touch-control chip IC is provided in the first non-display area BB1. Since a distance between the first non-display area BB1 and the touch-control chip IC is the smallest compared with a distance between a second non-display area BB2 and the touch-control chip IC, a distance between a third non-display area BB3 and the touch-control chip IC, and a distance between a fourth non-display area BB4 and the touch-control chip IC, respectively, a length of the first touch-control line Tx1 is relatively small on the premise that the first touch line Tx1 is not designed to be wound, so that a resistance of the first touch-control line Tx1 is relatively small. In the present disclosure, by providing the conductive winding section 1031 for the first touch-control line Tx1 in the first non-display area BB1, the length of the first touch-control line Tx1 can be increased, thereby increasing the resistance of the first touch-control line Tx1, so that the resistance of the first touch-control line Tx1 is substantially the same as resistances of other touch-control lines 103, thereby effectively improving the touch-control performance.

In some embodiments, in the display substrate provided by the embodiment of the present disclosure, as shown in FIGS. 1 and 3, in a second direction X, a width of the conductive winding portion 1031 of the first touch-control line Tx1 may be substantially the same as a width of the first touch-control electrode 104, and the second direction X and the first direction Y intersect, which is equivalent to providing the conductive winding portion 103 of the first touch-control line Tx1 electrically connected with the first touch-control electrode 104 at the first non-display area AA1 within a width range of the first touch-control electrode 104, thus avoiding the risk of a short circuit between the conductive winding portions 103 of different first touch-control lines Tx1 and facilitating wiring design.

In some embodiments, in the display substrate provided by the embodiment of the present disclosure, as shown in FIGS. 1 to 4, all the first touch-control lines Tx1 converge to a side of the first non-display area BB1 (for example, the right side in FIG. 1 and the left side in FIG. 3).

A length of the conductive winding portion 1031 included in the first touch-control line Tx1 is negatively correlated with a distance from the conductive winding portion 1031 included in the first touch-control line Tx1 to the converged side (e.g., right side in FIG. 1 and left side in FIG. 3). In other words, the smaller the distance from the conductive winding portion 1031 included in the first touch-control line Tx1 to the converged side (e.g., right side in FIG. 1), the greater the length of the conductive winding portion 1031 included in the first touch-control line Tx1, so that the lengths and resistances of the first touch-control lines Tx1 are substantially the same.

In some embodiments, in the display substrate provided by the embodiment of the present disclosure, as shown in FIGS. 1 to 4 and 7 to 12, the first touch-control line Tx1 may further include a fan-out lead portion 1032 for connecting the conductive winding portion 1031 with the touch-control chip IC, and the fan-out lead portion 1032 is located on a side of the conductive winding portions 1031 included in all the first touch-control lines Tx1 away from the display area AA.

The fan-out lead portion 1032 includes a first dislocation structure F1 located on a side of an area between adjacent conductive winding portions 1031 away from the display area AA, and distances between the same fan-out lead portion 1032 and adjacent first touch-control lines Tx1 are substantially the same at different positions of the conductive winding portion 1031.

Since the lengths of the conductive winding portions 1031 included in the first touch-control lines Tx1 are different, and a wiring space occupied by the longer conductive winding portion 1031 is greater than that occupied by the shorter conductive winding portion 1031, the fan-out lead portion 1032 connecting the conductive winding portion 1031 and the touch-control chip IC needs to be dislocated on a side of the adjacent conductive winding portions 1031 away from the display area AA. In the present disclosure, by providing the first dislocation structure F1 in the fan-out lead portion 1032, the purpose that the fan-out lead portion 1032 is dislocated on the side of the adjacent conductive winding portions 1031 away from the display area AA can be achieved, so that distances between the same fan-out lead portion 1032 and the adjacent first touch-control lines Tx1 are substantially the same.

In some embodiments, in the display substrate provided by the embodiment of the present disclosure, as shown in FIGS. 7 to 12, the first dislocation structure F1 may be a slope line segment sloping from a longer conductive winding portion 1031 included in the adjacent first touch-control lines Tx1 to a shorter conductive winding portion 1031 included in the adjacent first touch-control lines Tx1, so as to realize the effect of dislocating the fan-out lead portions 1032 on the side of the adjacent conductive winding portions 1031 away from the display area AA.

In some embodiments, in the display substrate provided by the embodiment of the present disclosure, as shown in FIGS. 7 to 12, lengths of the first dislocation structures F1 between the adjacent conductive winding portions 1031 may be decreased or increased in a direction away from the display area AA to avoid short circuit between different fan-out lead portions 1032.

In some embodiments, in the display substrate provided by the embodiment of the present disclosure, as shown in FIGS. 5 and 7 to 12, the conductive winding portion 1031 of the first touch-control line Tx1 may include a first line segment 1031*a* and a second line segment 1031*b* that are alternately and sequentially connected and extend substantially in a second direction X, and a minimum distance from the first line segment 1031*a* to the display area AA is smaller than a minimum distance from the second line segment 1032*b* to the display area AA, and connection between the first line segment 1031*a* and the second line segment 1031*b* may be a straight line segment or an arc line segment.

In some embodiments, in the display substrate provided by the embodiment of the present disclosure, as shown in FIGS. 7 to 12, in order to facilitate connection of the first touch-control electrode 104, a line width of a first line segment 1031*a* with the smallest distance from the display area AA may be greater than line widths of the other first line segments 1031*a* and line widths of all the second line segments 1031*b*, and the line widths of the other first line segments 1031*a* and the line widths of all the second line segments 1031*b* may be substantially equal.

In some embodiments, in the display substrate provided by the embodiment of the present disclosure, as shown in FIGS. 1 and 3, the non-display area BB may further include a second non-display area BB2 opposite to the first non-display area BB1, and a third non-display area BB3 connecting the first non-display area BB1 and the second non-display area BB2.

The plurality of touch-control lines 103 may further include a plurality of third touch-control lines Tx2 that extend from the second non-display area BB2 to the first non-display area BB1 via the third non-display area BB3. The third touch-control line Tx2 is electrically connected with the first touch-control electrode 104, and the first touch-control electrode 104 electrically connected with the third touch-control lines Tx2 and the first touch-control electrode 104 electrically connected with the first touch-control lines Tx1 are the same or different, that is, corresponding driving signals may be provided for the same or different first touch-control electrodes 104 through the first touch-control line Tx1 and the third touch-control line Tx2.

In some embodiments, in the display substrate provided by the embodiment of the present disclosure, as shown in FIGS. 1 and 3, limited by the size of the wiring space, a line width of the third touch-control line Tx2 in the third non-display area BB3 may be greater than that in the first non-display area BB1 and may be smaller than that in the second non-display area BB2, in other words, for one third touch-control line Tx2, its line width in the second non-display area BB2, its line width in the third non-display area BB2, and its line width in the first non-display area BB1 gradually decreases. It can be seen that, without changing the length, the line widths of the third touch-control line Tx2 in different non-display areas BB may be reasonably adjusted so that the resistance of the third touch-control line Tx2 is substantially the same as that of the first touch-control line Tx1 and that of the second touch-control line Rx.

In some embodiments, in the display substrate provided by the embodiment of the present disclosure, for convenience of fabrication, the line widths of the third touch-control lines Tx2 in the first non-display area BB1 are substantially the same; the line widths of the third touch-control lines Tx2 in the third non-display area BB3 are substantially the same; and in the second non-display area BB2, the line width of the third touch-control line Tx2 is positively correlated with a distance from the first touch-control electrode 104 electrically connected to the third touch-control line Tx2 to the third non-display area BB3, that is, the farther the distance from the first touch-control electrode 104 electrically connected to the third touch-control line Tx2 to the third non-display area BB3, the greater the line width of the third touch-control line Tx2.

In some embodiments, in the display substrate provided by the embodiment of the present disclosure, as shown in FIGS. 1 to 4, the non-display area BB may further include a fourth non-display area BB4 opposite to the third non-display area BB3.

A plurality of second touch-control lines Rx may extend from the fourth non-display area BB4 to the first non-display area BB1, and the conductive winding portion 1031 of the second touch-control line Rx may be located on a side of all the first touch-control lines Tx1 away from the display area AA, so as to avoid short-circuit failure between the second touch-control lines Rx and the first touch-control lines Tx1.

In some embodiments, in the display substrate provided by the embodiment of the present disclosure, as shown in FIGS. 1 to 4, in the second direction X, a width of the conductive winding portion 1031 of the second touch-control line Rx may be substantially the same as a width of at least one first touch-control electrode 1031. By arranging the conductive winding portion 1031 of the second touch-control line Rx in the first non-display area BB1 corresponding to the width of at least one first touch-control electrode 1031, the conductive winding portion 1031 of the second touch-control line Rx may be arranged in a range as large as possible, which is beneficial to arrangement of all the conductive winding portions 1031 of the second touch-control line Rx in a mutually nested winding manner.

In some embodiments, in the display substrate provided by the embodiment of the present disclosure, as shown in FIGS. 13 to 18, the conductive winding portion 1031 of the second touch-control line Rx may include a second dislocation structure F2, which may be located on a side of an area between the conductive winding portions 1031 included in the adjacent first touch-control lines Tx1 away from the display area AA. Distances between the conductive winding portion 1031 included in the same second touch-control line Rx and an adjacent first touch-control line Tx1 are substantially the same at different positions of the conductive winding portion 1031 included in the first touch-control line Tx1.

Since lengths of the conductive winding portions 1031 included in the first touch-control lines Tx1 are different, and a wiring space occupied by a longer conductive winding portion 1031 is greater than that occupied by a shorter conductive winding portion 1031, the second touch-control line Rx located on a side of the first touch-control line Tx1 away from the display area AA needs to be dislocated at a position of the conductive winding portion 1031 included in the adjacent first touch-control line Tx1. In the present disclosure, by arranging the second dislocation structure F2 in the conductive winding portions 1031 included in the second touch-control lines Rx, the purpose of the above-mentioned dislocation in the conductive winding portions 1031 included in the second touch-control lines Rx may be achieved.

In some embodiments, in the display substrate provided by the embodiment of the present disclosure, as shown in FIGS. 13 to 18, the second dislocation structure F2 may be a straight line segment perpendicular to the second direction X, or a slope line segment sloping from a longer conductive winding portion 1031 included in adjacent first touch-control lines Tx1 to a shorter conductive winding portion 1031 included in the adjacent first touch-control line sTx1, so as to realize the effect of dislocating the conductive winding portion 1031 included in the second touch-control line Rx on the side of the conductive winding portion 1031 included in the adjacent first touch-control line Tx1 away from the display area AA.

In some embodiments, in the display substrate provided by the embodiment of the present disclosure, as shown in FIGS. 13 to 18, lengths of the second dislocation structures F2 between the conductive winding portions 1031 included in the adjacent first touch-control lines Tx1 are substantially the same, so as to avoid short circuit between different fan-out lead portions 1032.

In some embodiments, in the display substrate provided by the embodiment of the present disclosure, as shown in FIGS. 2, 4 and 13 to 18, a length of the conductive winding portion 1031 included in the second touch-control line Rx may be negatively correlated with a minimum distance from the conductive winding portion 1031 of the second touch-control line Rx to the display area AA. That is, the smaller the minimum distance between the conductive winding portion 1031 of the second touch-control line Rx and the display area AA, the greater the length of the conductive winding portion 1031 included in the second touch-control line Rx. In this way, a shorter conductive winding portion 1031 included in the second touch-control line Rx may be easily nested in a space surrounded by a longer conductive winding portion 1031 included in the second touch-control line Rx.

In some embodiments, in the display substrate provided by the embodiment of the present disclosure, as shown in FIGS. 13 to 18, in order to facilitate to achieve the electrical connection between the second touch-control line Rx and the second touch-control electrode 105, among the conductive winding portions 1031 of all the second touch-control lines Rx, a line width of the outermost conductive winding portion 1031 is greater than line widths of the other nested conductive winding portions 1031, and the line widths of the other conductive winding portions 1031 may be substantially the same.

In some embodiments, as shown in FIGS. 1 and 3, the display substrate provided by the embodiment of the present disclosure may further include a plurality of second touch-control electrodes 105 located in the display area AA, the second touch-control electrodes 105 extend in a second direction X, the second direction X intersects the first direction Y intersecting, and the second touch-control electrodes 105 is electrically connected with the second touch-control line Rx.

In some embodiments, the first touch-control electrode 104 may be a touch-control driving electrode and the second touch-control electrode 105 may be a touch-control sensing electrode, or the first touch-control electrode 104 may be a touch-control sensing electrode and the second touch-control electrode 105 may be a touch-control driving electrode, which is not limited herein. The first touch-control electrode 104 and the second touch-control electrode 105 may have a metal mesh structure of the same layer and material, wherein the metal meshes of the same first touch-control electrode 104 are integrally arranged, and the metal meshes of the same second touch-control electrode 105 are disconnected at a position intersecting with the first touch-control electrode 104, and electrically connected through a bridge layer.

In some embodiments, in order to reduce the resistance, the first touch-control line Tx1, the second touch-control line Rx, and the third touch-control line Tx2 may be arranged with double-layer wiring, specifically, wiring may be made at a layer where the first touch-control electrode 104 and the second touch-control electrode 105 are located (i.e., MB layer) and the bridge layer (i.e., MA layer), respectively (as shown in FIGS. 7 to 18), and the double-layer wiring of the same touch-control line 103 may be connected through a via h.

Figure 19:
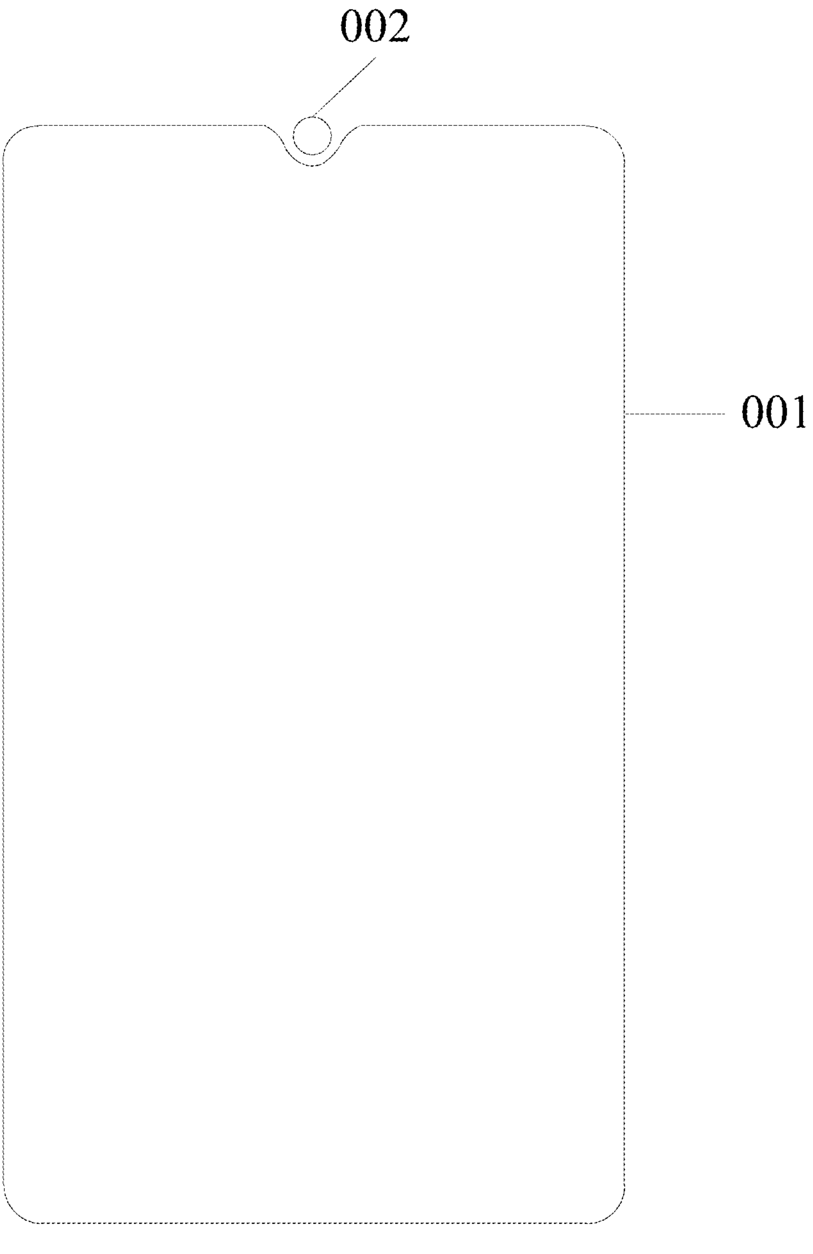
FIG. 19 is a schematic diagram of a structure of a display apparatus according to an embodiment of the present disclosure.

Based on the same inventive concept, the present disclosure further provides a display apparatus. As shown in FIG. 19, it includes the display substrate 001 provided by the embodiment of the present disclosure, which may be an OLED display substrate. Since the principle for solving problems of the display apparatus is similar to the principle for solving problems of the display substrate described above, the embodiments of the display substrate described above may be referred to for the implementations of the display apparatus, which will not be repeated.

Figure 20:
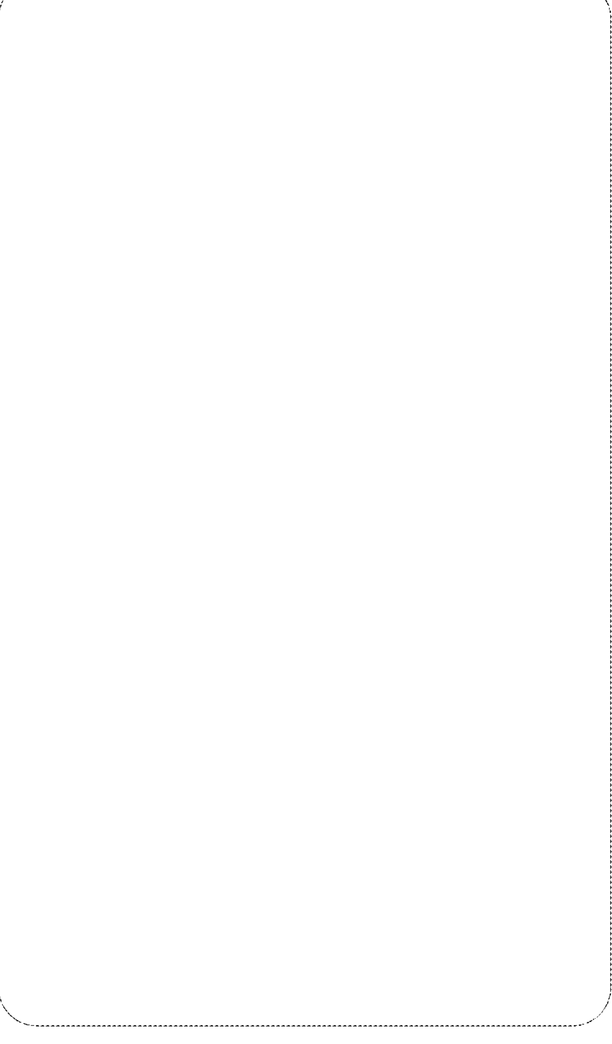
FIG. 20 is a schematic diagram of another structure of a display apparatus according to an embodiment of the present disclosure.
Figure 21:
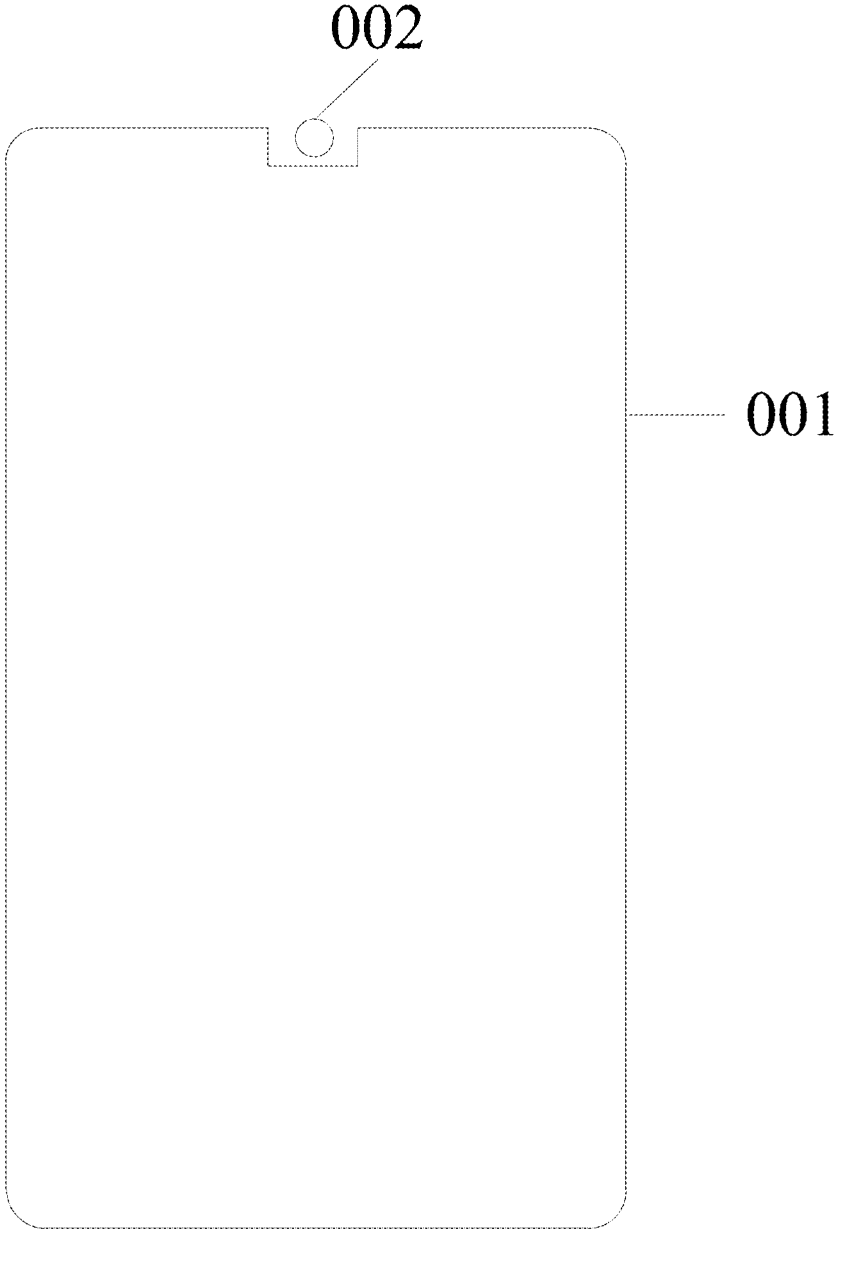
FIG. 21 is a schematic diagram of yet another structure of a display apparatus according to an embodiment of the present disclosure.

In some embodiments, as shown in FIG. 19, the display substrate 001 may be provided with a recess portion similar to a "water drop", and components such as a camera 002 may be provided at the recess portion. Of course, in a specific implementation, the display apparatus provided by the embodiment of the present disclosure may also be a full screen (as shown in FIG. 20) or a Notch screen (as shown in FIG. 21), which is not limited herein.

In some embodiments, the display apparatus provided by the embodiment of the present disclosure may be a mobile phone, a tablet computer, a television, a display, a notebook computer, a digital photo frame, a navigator, a smart watch, a fitness wristband, a personal digital assistant, or any product or component with a display function. The display apparatus provided by the embodiment of the present disclosure may further include, but is not limited to, a radio frequency unit, a network module, an audio output unit, an input unit, a sensor, a display unit, a user input unit, an interface unit, a memory, a processor, a power supply and other components. It will be understood by those skilled in the art that the composition of the display apparatus described above does not constitute a limitation on the display apparatus and that the display apparatus may include more or fewer of the components described above, or a combination of some components, or different component arrangements.

Apparently, those skilled in the art can make various modifications and variations to the embodiments of the present invention without departing from the spirit and scope of the embodiments of the present invention. Thus, if these modifications and variations to the embodiments of the present invention fall within the scope of the claims of the present invention and their equivalent techniques, the present invention is intended to include these modifications and variations.

The invention claimed is:

1. A display substrate, comprising:

a base substrate comprising a display area and a non-display area located around the display area;

a blocking dam located in the non-display area and arranged surrounding the display area; and a plurality of touch-control lines located in the non-display area, wherein at least some of the touch-control lines comprise conductive winding portions to make resistances of the touch-control lines substantially same, an orthographic projection of a conductive winding portion on the base substrate is located between an orthographic projection of the blocking dam on the base substrate and the display area;

wherein the at least some of the touch-control lines comprise a plurality of first touch-control lines and a plurality of second touch-control lines, a conductive winding portion of at least one first touch-control line of the first touch-control lines is arranged in an independent winding manner, and a conductive winding portion of at least one second touch-control line of the second touch-control lines are arranged in a mutually nested winding manner;

wherein the non-display area comprises a first non-display area for bonding with a touch-control chip;

the display substrate further comprises a plurality of first touch-control electrodes located in the display area, each of the first touch-control electrodes extends in a first direction, at least some of the first touch-control electrodes are electrically connected with the first touch-control lines, and the first direction is a direction from the first non-display area to the display area; and the first touch-control lines are located in the first non-display area, and conductive winding portions of the first touch-control lines are electrically connected with first touch-control electrodes;

wherein a width of the conductive winding portion of the at least one first touch-control line is substantially the same as a width of a first touch-control electrode in a second direction, and the second direction intersects the first direction.

2. The display substrate according to claim 1, wherein all the first touch-control lines converge to a side of the first non-display area;

a length of the conductive winding portion of the at least one first touch-control line is negatively correlated with a distance from the conductive winding portion of the at least one first touch-control line to the converged side.

3. The display substrate according to claim 2, wherein the at least one first touch-control line further comprises a fan-out lead portion configured to connect the conductive winding portion of the at least one first touch-control line with the touch-control chip, and the fan-out lead portion is located on a side of conductive winding portions comprised in all the first touch-control lines away from the display area; and the fan-out lead portion comprises a first dislocation structure located on a side of an area between adjacent conductive winding portions away from the display area, and distances between the same fan-out lead portion and an adjacent first touch-control line are substantially the same at different positions of the conductive winding portion of the at least one first touch-control line.

4. The display substrate according to claim 3, wherein the first dislocation structure is a slope line segment sloping from a longer conductive winding portion comprised in adjacent first touch-control lines to a shorter conductive winding portion comprised in the adjacent first touch-control lines.

5. The display substrate according to claim 4, wherein lengths of first dislocation structures between adjacent conductive winding portions decreases or increases in a direction away from the display area.

6. The display substrate according to claim 1, wherein the conductive winding portion of the at least one first touch-control line comprises a first line segment and a second line segment that are alternately and sequentially connected, the first line segment and the second line segment extend substantially in a second direction intersected with the first direction, a minimum distance from the first line segment to the display area is smaller than a minimum distance from the second line segment to the display area, and connection between the first line segment and the second line segment is a straight line segment or an arc line segment.

7. The display substrate according to claim 6, wherein a line width of a first line segment with a smallest distance from the display area is greater than line widths of other first line segments and line widths of all the second line segments, and the line widths of the other first line segments and the line widths of all the second line segments are substantially equal.

8. The display substrate according to claim 1, wherein the non-display area further comprises a second non-display area opposite to the first non-display area, and a third non-display area connecting the first non-display area and the second non-display area; and the plurality of touch-control lines further comprise a plurality of third touch-control lines that extend from the second non-display area to the first non-display area via the third non-display area, a third touch-control line is electrically connected with the first touch-control electrode, and the first touch-control electrode electrically connected with the third touch-control line and the first touch-control electrode electrically connected with the at least one first touch-control line are the same or different.

9. The display substrate according to claim 8, wherein a line width of the third touch-control line in the third non-display area is greater than a line width of the third touch-control line in the first non-display area and smaller than a line width of the third touch-control line in the second non-display area.

10. The display substrate according to claim 9, wherein in the first non-display area, line widths of the third touch-control lines are substantially the same; in the third non-display area, line widths of the third touch-control lines are substantially the same; and in the second non-display area, the line width of the third touch-control line is positively correlated with a distance from the first touch-control electrode electrically connected with the third touch-control line to the third non-display area.

11. The display substrate according to claim 8, wherein the non-display area further comprises: a fourth non-display area opposite to the third non-display area; and the plurality of second touch-control lines extend from the fourth non-display area to the first non-display area, and the conductive winding portion of the at least one second touch-control line is located on a side of all the first touch-control lines away from the display area.

12. The display substrate according to claim 11, wherein a width of the conductive winding portion of the at least one second touch-control line is substantially the same as a width of at least one of the first touch-control electrodes in a second direction intersected with the first direction;

or a length of the conductive winding portion of the at least one second touch-control line is negatively correlated with a minimum distance from the conductive winding portion of the at least one second touch-control line to the display area;

or among the conductive winding portions of all the second touch-control lines, a line width of an outermost conductive winding portion is greater than line widths of other nested conductive winding portions, and the line widths of the other conductive winding portions are substantially the same.

13. The display substrate according to claim 12, wherein the conductive winding portion of the at least one second touch-control line comprises a second dislocation structure located on a side of an area between conductive winding portions comprised in adjacent first touch-control lines away from the display area, and distances between a conductive winding portion comprised in a same second touch-control line of the second touch-control lines and an adjacent first touch-control line are substantially the same at different positions of the conductive winding portion comprised in the at least one first touch-control line.

14. The display substrate according to claim 13, wherein the second dislocation structure is a straight line segment perpendicular to the second direction or a slope line segment sloping from a longer conductive wound portion comprised in adjacent first touch-control lines to a shorter conductive wound portion comprised in the adjacent first touch-control lines.

15. The display substrate according to claim 14, wherein lengths of second dislocation structures between the conductive winding portions comprised in the adjacent first touch-control lines are substantially the same.

16. The display substrate according to claim 1, further comprising a plurality of second touch-control electrodes located in the display area, wherein the second touch-control electrodes extend in a second direction that intersects the first direction, and the second touch-control electrodes are electrically connected with the second touch-control lines.

17. The display substrate according to claim 1, wherein a minimum distance between an orthographic projection of all the conductive winding portions on the base substrate and an orthographic projection of the blocking dam on the base substrate is greater than or equal to 130 μm; and a minimum distance between the orthographic projection of all of the conductive winding portions on the base substrate and the display area is greater than or equal to 20 μm.

18. A display apparatus, comprising the display substrate of claim 1.

* * * * *